(12) United States Patent
Bhattacharya et al.

(10) Patent No.: US 10,409,941 B2
(45) Date of Patent: Sep. 10, 2019

(54) VISUAL REPRESENTATION OF CIRCUIT RELATED DATA

(71) Applicant: Synopsys, Inc., Mountain View, CA (US)

(72) Inventors: Mayukh Bhattacharya, Palo Alto, CA (US); Chih-Ping Antony Fan, Saratoga, CA (US); Huiping Huang, Pleasanton, CA (US); Vinay Nulkar, Santa Clara, CA (US); Amelia Huimin Shen, Saratoga, CA (US)

(73) Assignee: SYNOPSYS, INC., Mountain View, CA (US)

( * ) Notice: Subject to any disclaimer, the term of this patent is extended or adjusted under 35 U.S.C. 154(b) by 876 days.

(21) Appl. No.: 14/069,326

(22) Filed: Oct. 31, 2013

(65) Prior Publication Data

US 2015/0120250 A1 Apr. 30, 2015

(51) Int. Cl.
*G06F 17/50* (2006.01)

(52) U.S. Cl.
CPC ................. *G06F 17/5068* (2013.01)

(58) Field of Classification Search
CPC .................................................. G06F 17/5068
USPC ............................................................. 703/1
See application file for complete search history.

(56) References Cited

U.S. PATENT DOCUMENTS

| 5,452,225 | A  | * | 9/1995  | Hammer ............. G06F 17/5022 703/19 |
| 6,182,258 | B1 | * | 1/2001  | Hollander ........ G01R 31/31704 714/739 |
| 6,484,134 | B1 | * | 11/2002 | Hoskote ........... G01R 31/31835 703/14 |
| 6,629,299 | B1 | * | 9/2003  | Iwanishi ............. G06F 17/5022 703/19 |
| 7,076,742 | B1 |   | 7/2006  | Thorn et al. |
| 7,605,813 | B2 | * | 10/2009 | Uthe ..................... G06T 11/206 345/440 |
| 7,870,509 | B2 | * | 1/2011  | Cao ....................... G06F 9/4443 715/765 |
| 8,079,001 | B2 | * | 12/2011 | Zhu .......................... G06F 8/10 716/106 |
| 8,095,514 | B2 |   | 1/2012  | Beresniewicz et al. |
| 8,527,921 | B2 | * | 9/2013  | Cerny ................. G06F 17/5022 716/104 |
| 8,527,936 | B2 | * | 9/2013  | Jain ..................... G06F 17/5022 716/103 |
| 8,966,384 | B2 | * | 2/2015  | Rye .................... G05B 23/0216 715/764 |

(Continued)

OTHER PUBLICATIONS

Ioannis Savvidis, Power Savings in MPSoC, 2009, Master of Science Thesis Stockholm, Sweden, pp. 1-92.*

*Primary Examiner* — Juan C Ochoa
(74) *Attorney, Agent, or Firm* — Alston & Bird LLP

(57) ABSTRACT

A circuit description, such as a hierarchical netlist, is obtained for an integrated circuit. Based on the circuit description, a treemap representation is rendered using blocks, nodes, and/or devices from the hierarchical netlist as objects, or leaves, in the treemap representation. Using a virtual layout, the leaves are positioned in the treemap representation independent of their physical layout. Circuit properties for the electronic design are also obtained using various methods such as a circuit simulator. The circuit properties are displayed to a user on the treemap representation.

19 Claims, 7 Drawing Sheets

(56) References Cited

U.S. PATENT DOCUMENTS

| | | | |
|---|---|---|---|
| 9,158,874 B1* | 10/2015 | Ranjan | G06F 17/5022 |
| 2003/0204817 A1* | 10/2003 | Kashyap | G06F 17/5036 |
| | | | 716/102 |
| 2004/0230927 A1* | 11/2004 | Chen | G06F 17/504 |
| | | | 716/106 |
| 2004/0263513 A1 | 12/2004 | Smith et al. | |
| 2005/0188337 A1* | 8/2005 | Baumgartner | G06F 17/5022 |
| | | | 716/107 |
| 2008/0088628 A1 | 4/2008 | Lu et al. | |
| 2011/0292046 A1 | 12/2011 | Gotz | |
| 2011/0292050 A1 | 12/2011 | Gotz | |
| 2012/0151423 A1* | 6/2012 | Baumgartner | G06F 17/504 |
| | | | 716/107 |
| 2012/0233573 A1 | 9/2012 | Sullivan et al. | |
| 2012/0317518 A1 | 12/2012 | Wittig et al. | |
| 2012/0317543 A1 | 12/2012 | Baudel et al. | |
| 2013/0127870 A1 | 5/2013 | Ba Del et al. | |

* cited by examiner

VISUAL REPRESENTATION OF CIRCUIT RELATED DATA

FIELD OF ART

This application relates generally to semiconductor circuits and more particularly to visual representation of a semiconductor circuit design and related data.

BACKGROUND

Complex electronic systems, built from tens or hundreds of millions of transistors, have become nearly ubiquitous in modern-day life. The market drives ever-increasing demands for performance, advanced feature sets, system versatility, and a variety of other rapidly changing system requirements. This leads to ever decreasing product life cycles and thus also leads to ever-shorter product development design cycles. To handle such electronic system complexity, designers utilize many electronic tools to address the complexity and shortened design cycles. Even with modern electronic design automation (EDA) tools, it is very difficult for a human designer to fully comprehend many modern electronic systems, simply due to the enormous scale of the designs.

Logic systems can be described at a variety of levels of abstraction, from low-level transistor layouts to high-level description languages. Most designers describe and design their electronic systems at a high-level of abstraction using an IEEE Standard hardware description language (HDL) such as Verilog™, SystemVerilog™, or VHDL™. High-level HDL is easier for designers to understand, especially for large, complex systems, and can describe sprawling concepts that are difficult to grasp using a lower level of abstraction. The HDL description can be converted into any other level of abstraction that is helpful to the developers. For example, a high-level description can be converted to a logic-level description such as a register-transfer language (RTL), a gate-level (GL) description, a layout-level description, or a mask-level description. Each lower level of abstraction introduces more detail into the design description.

Many different graphical representations are used during a typical design cycle to help the designer create and debug the electronic system. During design, block diagrams, schematic diagrams, physical layouts, and the like, are all used in various ways to represent design data. During the latter design stages, when a circuit's functionality is verified by circuit simulation, the aforementioned views are, in many cases, either not convenient or not available at all. The input data to a circuit simulator is usually one or more text files containing a hierarchical description of the circuit (i.e. a netlist) in a specific standard format optimized for the specific type of simulation to be run. Such formats are not optimized for human readability, and can be quite difficult for a human designer to understand. The output of a circuit simulation includes voltages and current data corresponding to circuit nodes and devices. Relating the output of the circuit simulation to the design data can be important in many situations. When only the netlist is available as the representation of the design data, legacy systems do not have a way to display the data in a way that is easy for a human to understand.

SUMMARY

A circuit description, such as a hierarchical netlist, is obtained for an electronic design. A treemap representation is rendered, based on a circuit description using blocks, nodes, and/or devices from the hierarchical netlist as objects, or leaves, in the treemap representation. The leaves are positioned in the treemap representation using a virtual layout, which is not based on a physical layout. Circuit properties for the electronic design are also obtained, such as from results calculated by a circuit simulator. The circuit properties are displayed to a user on the treemap representation. A computer-implemented method for circuit visualization is disclosed comprising: obtaining a circuit description; rendering a circuit representation based on the circuit description using a treemap representation; and displaying circuit properties on the treemap representation. In embodiments, Boolean or regular expression combinations of properties are used to generate the circuit properties, which are then displayed in treemap form.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Configuration Overview

Figure 1:
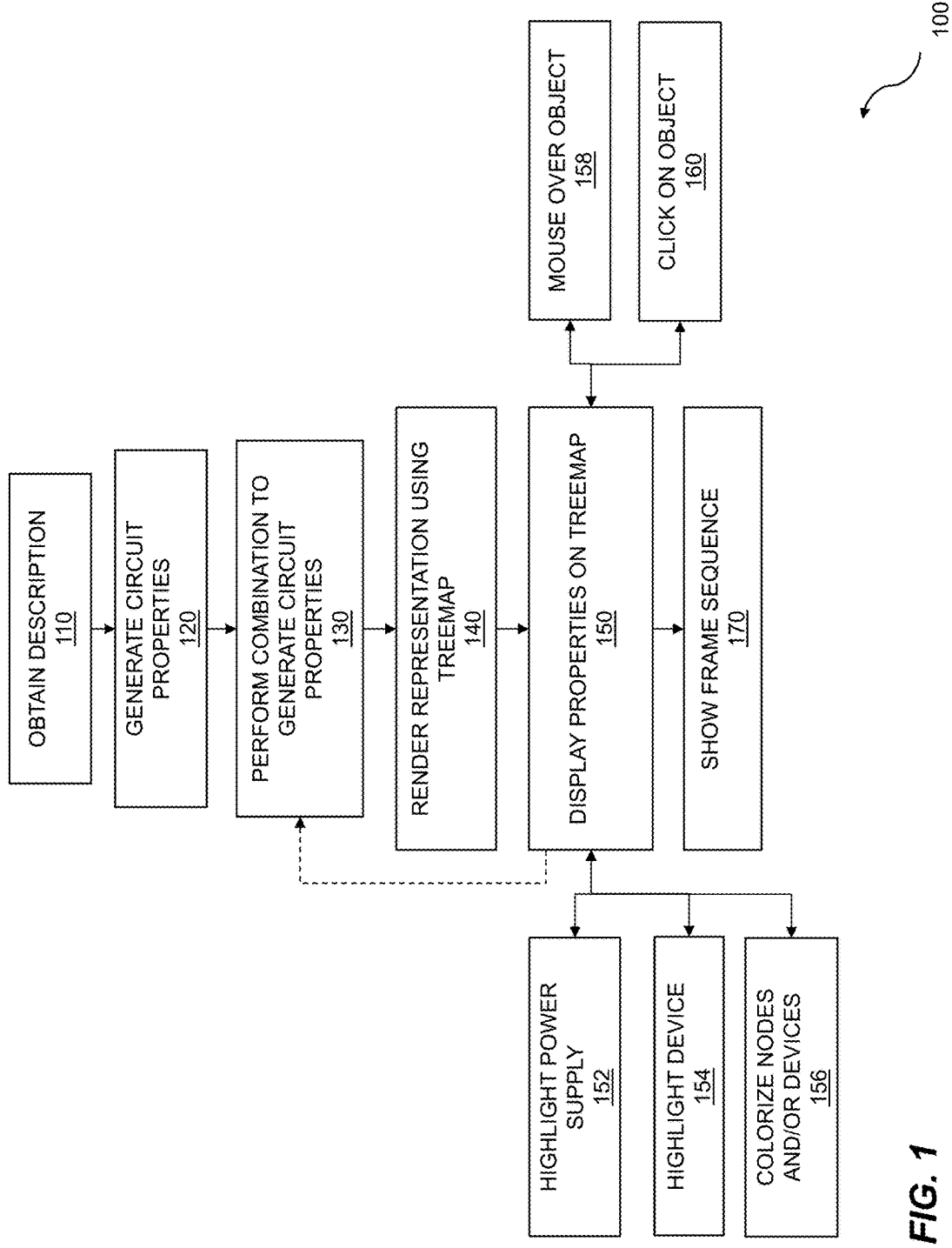
FIG. 1 is a flow diagram for visual representation of circuit data.

An electronic design, such as a design for an integrated circuit, is described using one or more methods, including a netlist representation. A netlist can be based on nodes, devices, or both, depending on the embodiment. The electronic design is then simulated, in many embodiments, to generate circuit properties for the devices, blocks, and or nodes in the netlist, and a visual representation of the netlist is then generated within which circuit properties and/or other data is displayed. A treemap can be used as the visual representation of the netlist. The treemap does not reflect a physical layout and no knowledge of the physical layout is required in order to generate a treemap. A treemap can include various blocks in a design, but in some embodiments will not include connectivity information between the blocks. In some embodiments, a treemap representation includes only nodes. In other embodiments, a combination of nodes and blocks can be displayed. By using a treemap representation, useful information can be graphically displayed about a design without burdening the viewer with unneeded information or information which may not be wanted to be communicated to the viewer. Displaying the circuit properties on the treemap provides a method for conveying simulation information to a designer in a way that is easily understood. Such a visual representation can be used by the designer during development and debug of the electronic design, and can also be used by developers of circuit simulators. In some embodiments, a rectangular treemap visualization of a netlist is created where the objects of the netlist are portrayed with shapes having 90 degree angles. In such a treemap, a rectangle in the treemap can also be referred to as a leaf of the treemap. If the netlist is hierarchical, the treemap can be created for any level of the hierarchy and can show some or all of the higher-level hierarchy of the netlist by including rectangles for objects in a lower level of the hierarchy nested inside of a rectangle representing an object at a higher level of the hierarchy. In some embodiments, a hierarchical treemap representation is created from a flat netlist by using the hierarchy that is implicit in the nodal and device names of the flat netlist. In some embodiments, only a portion of the netlist is shown in the treemap, such as one block at an upper level of the hierarchy. Depending on the embodiment, the treemap representation can be created showing any combination of blocks, devices, nodes, and properties, where a leaf can represent a block, device, or node. A property of that leaf is represented by a visual characteristic of the rectangle representing the leaf. The visual characteristic can be a highlighting, coloring, fill pattern, or some other display cue.

In some embodiments, the results of one or more simulations of the electronic design represented by the netlist are used as properties for a leaf that represents a block, device, or node. In embodiments, the properties of a leaf are calculated based on one or more factors other than the results of simulations. The property of the rectangle that represents the property of the block, device, or node, can be any type of property, such as, but not limited to, one or more of a color of an outline of the rectangle, a fill color of the rectangle, the presence or color of a highlight around the rectangle, a size of the rectangle, a line thickness of the outline of the rectangle, a shading or cross-hatch pattern of the rectangle, a "height" of a 3D representation of the rectangle, or something shown inside of the rectangle. In some embodiments, pictures, icons, waveforms, and textual information, among other items, represent potential visualizations to represent the property of the block, device, or node within the rectangle.

In some embodiments, the treemap representation is interactive, allowing a user to interact with a rectangle using human computer interactions, such as, but not limited to, a keyboard input, a mouse-over, a mouse click, a touch on a touchscreen, or combinations of interactions, to change the treemap representation in some way. In various embodiments, different types of interactions cause different changes to the treemap representation. In some embodiments, a level of the hierarchy displayed is changed by interacting with a rectangle of the treemap representation, zooming in to more detail of the block represented by the rectangle, or zooming out to show a higher level of hierarchy. In some embodiments, the property of the object represented by the rectangle is changed based on the interaction. In one embodiment, a voltage waveform associated with the object is displayed in response to a mouse-over of the rectangle. In some embodiments, if a rectangle is clicked on, text representing one or more properties of the object, such as voltage or current, is displayed within the rectangle.

Some embodiments include one or more windows on the display in addition to a window to display the treemap representation, such as, but not limited to, a window displaying properties of a currently selected rectangle, a window displaying names of objects represented by selected rectangles, a window for entering queries or selection criteria for objects, or a window displaying voltage or current waveforms associated with a selected rectangle. Selection of rectangles/objects can be performed either by interaction with the treemap representation or through a query or selection criteria.

At least some embodiments of the present disclosure do not need connectivity or location information from placement or routing in order to generate a treemap. Instead, a virtual placement is done as part of the treemap construction that allows the netlist content to be visualized in a compact and easy-to-navigate way. At least some embodiments create a virtual placement for the leaves based on an aspect ratio of the display or window to maximize visual information in minimum space. Some embodiments preserve just the necessary information for debugging of design-related problems or simulation-related problems based purely on the netlist and data generated by the simulator.

Various embodiments are used with various types of simulations. The types of design debug simulation data that can be presented by different embodiments include, but are not limited to, operating point voltages, maximum or minimum voltages, transient voltages, node activity levels, maximum or minimum currents, operating point currents, transient currents, signal dependencies, fan-in levels, and fan-out levels. The types of simulation debug data that can be presented by different embodiments include, but are not limited to, partitioning information, convergence problems, noise or activity levels of nodes, identification of power supply nodes, and identification of which devices are designated as analog devices and which devices are designated as digital devices by the simulator.

As an example, in one embodiment, a treemap representation of nodes can be configured to show voltages at a specific point in time by assigning unique coloration. For example, nodes at a valid logic '0' could be shown in blue, nodes at a valid logic '1' could be shown in green, and nodes at some other voltage outside of the valid ranges shown in red. Continuing to another application, the treemap representation could then be reconfigured to illustrate switching activity over a period of time using greyscale to map a node that is not switching to a black rectangle and the fastest switching node to a full white rectangle. In this embodiment, each node is then represented by a rectangle filled with a greyscale intensity that is determined based on the switching rate of that node as a percentage of the switching rate of the fastest switching node. The treemap representation of the embodiment can also be configured to highlight rectangles representing nodes with a fan-out over a specified maximum. The embodiment can also be configured to show many other types of information, some of which is pre-calculated and stored based on the simulation results, and some of which is calculated on-the-fly, based on queries entered by the user.

The techniques and systems described herein allow simulation-related data for an electronic design to be displayed based on a hierarchical netlist description, without having to refer to physical design data or to higher level descriptions such as schematics or HDL code. This allows the simulation-related data to be displayed without needing to provide the intellectual property inherent in the physical design data or the higher level descriptions. It also allows the simulation-related data to be displayed on one EDA system without accessing proprietary file formats from another EDA vendor. If the netlist can be simulated, the results can be displayed in a meaningful manner to a user using only the netlist information and the results of the simulation.

It should be understood that an integrated circuit can be described using a hierarchical or flat netlist. The netlist can be generated by any type of electronic design methodology, including circuit synthesis from a hardware description language (HDL) such as Verilog, SystemVerilog, or VHDL, from a schematic, or from some other type of electronic design automation (EDA) tool. The netlist can be in various formats, including an industry standard format such as the electronic design interchange format (EDIF) or a proprietary format. The various netlists can be represented in treemap form and the circuit properties highlighted on these treemaps.

Further Details

FIG. 1 is a flow diagram for visual representation of circuit data. The flow 100 shows an embodiment of a computer-implemented method for circuit visualization. The flow 100 includes obtaining a circuit description 110. The circuit description can be any type of circuit description and include various objects. In at least some embodiments, the circuit description includes a netlist that can be a hierarchical netlist or a flat netlist. An object can be a block, a device, a node, and can have one or more property associated with the object, so an object may include a device, a block, a node, and/or a property. If the circuit description does not include a netlist, a netlist that includes objects may be extracted from the circuit description, or a set of objects to use in a treemap representation may be extracted from the circuit description.

The flow 100 includes generating circuit properties 120. The circuit properties may be generated using a simulation, by extracting the circuit properties based on the design description, or by other methods. In some embodiments, the circuit properties are included in the design description. The circuit properties may include one or more of a timing, a power, a frequency, a voltage, a waveform, a nodal activity, a current, a fan-in dependency, a fan-out dependency, a logic cone, a convergence problem, an activity level, a noise level, a temperature, a sensitivity, or device aging. The flow 100 also includes performing one or more of Boolean combination or regular expression combination 130 of properties to generate the circuit properties. However, some embodiments may not include the capability to perform one or more of Boolean combination or regular expression combination 130, and some embodiments may also allow the use of arithmetic expressions in the combinations of circuit properties. An example of a Boolean combination is to generate a Boolean property for nodes that is calculated by the AND of the Boolean state of the node at a first time and the Boolean state of the node at a second time. An example regular expression is to identify all blocks that include 10 or more devices. An example of an arithmetic expression is to calculate an instantaneous power for a device by multiplying the voltage of the power supply of the device by the current input for the device. An example of a Boolean combination of regular expressions is to calculate a Boolean property for nodes based on having a switching frequency above 1 megahertz (MHz) AND either having a fan-out of greater than 4 OR having a capacitance greater than 100 picofarads (pF).

The flow 100 includes rendering a circuit representation based on the circuit description using a treemap representation 140. Leaves in the treemap layout represent an object which may include one or more blocks, devices, or nodes, depending on the embodiment. A block can contain other blocks, devices and/or nodes. The treemap representation can be a hierarchical treemap or a non-hierarchical treemap, depending on the embodiment. In at least some embodiments, the treemap uses rectangles for leaves in a virtual layout and may be scaled to fit within a display or a window on a display. The virtual layout does not have any correspondence to a physical layout of the electronic design described by the circuit description in some embodiments. In some embodiments, the treemap includes only devices, and does not show any interconnect between the devices, i.e. the nodes are not shown. In some embodiments, the treemap includes only nodes without any devices shown. In some embodiments, a combination of blocks and devices are included in the treemap and placed within a hierarchy so that a rectangle for a particular block surrounds other rectangles representing blocks and devices that are included in the particular block. In some embodiments, a combination of blocks, devices, and nodes are included in the treemap. The treemap representation can represent the entire electronic design described in the circuit description, or a subset of the circuit description, depending on the embodiment and, in some cases, inputs from a user.

The flow 100 further comprises displaying circuit properties on the treemap representation 150. Depending on the embodiment, and in some cases, input from a user, a single type of circuit property is displayed on the treemap representation, or any subset of the circuit properties generated is be displayed on the treemap representation. In some embodiments, user input can cause additional Boolean combinations or regular expression combinations of properties to be generated 130 which are then displayed on the treemap representation 150. In some embodiments, results from two or more simulations may be included in the circuit properties and the displaying may highlight a difference between the two or more simulations. In some embodiments, the properties are displayed on each leaf of the treemap, or on each lowest-level leaf as shown in a hierarchical treemap. In some embodiments, properties are displayed on a subset of selected leaves of the treemap. In at least some embodiments, one or more properties are shown on all leaves and one or more additional properties are shown on selected leaves. In at least some embodiments, one or more properties are shown on unselected leaves and one or more other properties are shown on selected leaves. Any combination of properties may be shown on any combination of leaves of the treemap, depending on the embodiment.

The displaying of the circuit properties can be based on selection of leaves, or objects, within the treemap. Selection can be done in different ways, depending on the embodiment, including, but not limited to mousing over an object, clicking on an object, touching an object on a touchscreen, keystrokes on a keyboard, or "lassoing" one or more objects using a pointing device. Therefore, the displaying of the circuit properties may be accomplished by mousing over an object 158 in the treemap representation, and/or the displaying of the circuit properties may be accomplished by clicking on an object 160 in the treemap representation.

The circuit properties can be displayed using one or more visual elements in a rectangle/leaf/object such as, but not limited to, one or more of a color of an outline of the rectangle, a fill color of the rectangle, the presence or color of a highlight around the rectangle, a size of the rectangle, a line thickness of the outline of the rectangle, a shading or cross-hatch pattern of the rectangle, a "height" of a 3D representation of the rectangle, or something shown inside of the rectangle. Thus, the displaying may include a colorization, a line-type modification, or a cross-hatch modification of the treemap representation. Examples of what can be shown inside the rectangle to represent the property of the block, device, or node, in various embodiments include, but are not limited to, pictures, icons, waveforms, and textual information. Circuit properties for a selected object may be displayed in a separate window instead of, or in addition to, being displayed in the selected rectangle. An example of displaying a circuit property on a treemap representation is highlighting a power-supply node 152. Another example of displaying a circuit property on a treemap representation is highlighting devices 154 identified as one or more of an analog device or a digital device. Another example of displaying a circuit property on a treemap representation is colorizing nodes and/or devices 156 based on switching frequency.

In some embodiments, visual aspects of the objects in the treemap representation can be changed based on the topology of the circuit, such as the hierarchy of the design or the partitioning of the circuit, as opposed to the electrical behavior of the circuit. The partitioning may be based on one or more of channel connections, DC-connected paths, AC-connected paths, or low impedance paths, among other things, and/or the partitioning may be based on the hierarchy. The partitioning can be shown in various ways, but in some embodiments, colorization may indicate partitions within the circuit description. So the displaying may also include partitioning the circuit representation.

In some embodiments, the displaying includes showing a frame sequence 170 that describes circuit properties over time. The frame sequence may be a free-running animation or may be single stepped by the user. In some embodiments, the frame sequence may loop through a fixed time period once, or continuously until stopped by the user. In some embodiments, the frame sequence may continue through time, moving forward until it is stopped by the user. The animation may be shown in real-time, in slow-motion, or in accelerated time, depending on the embodiment and in some cases, input from a user. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
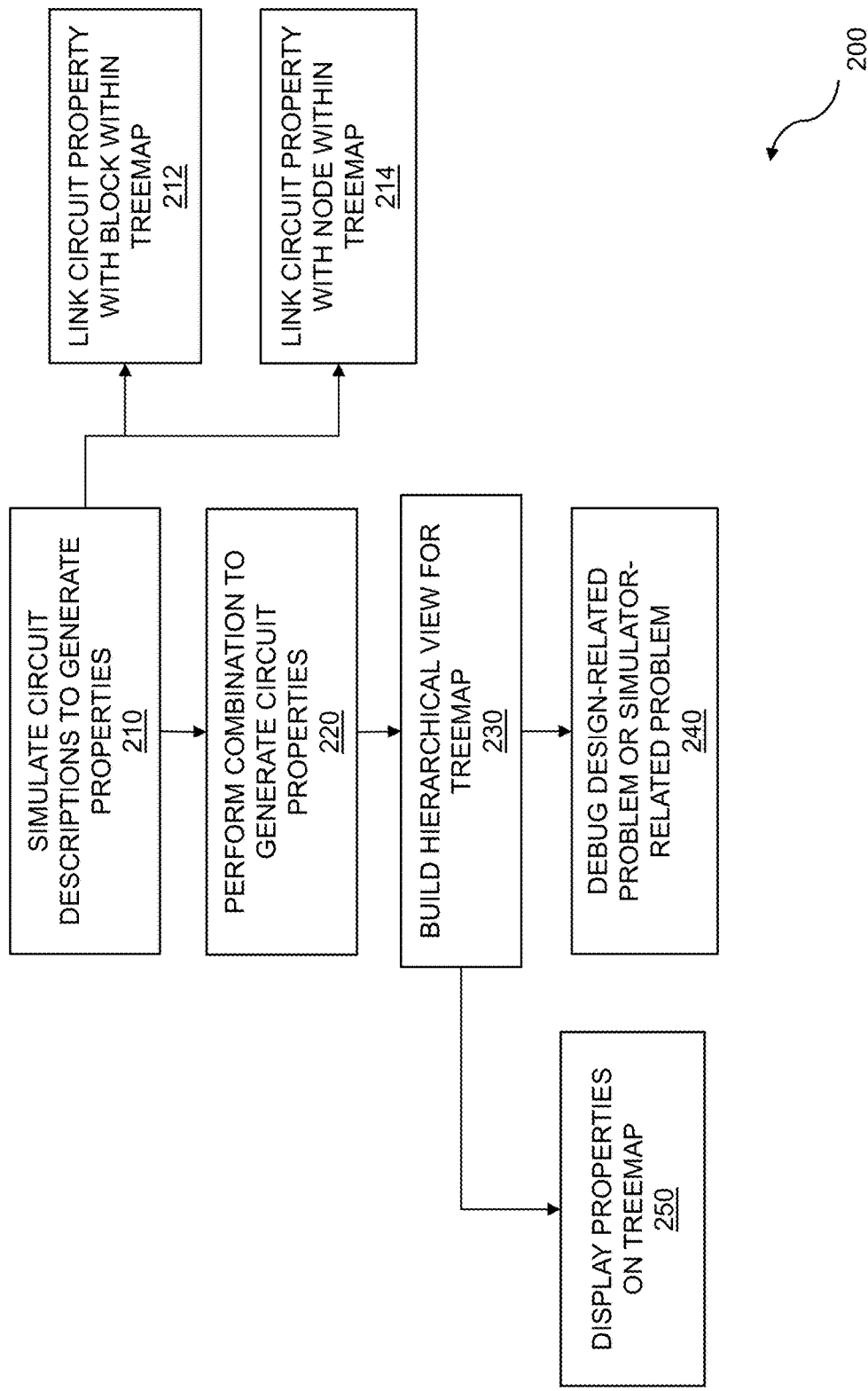
FIG. 2 is flow diagram for property generation and simulation.

FIG. 2 is a flow diagram for property generation and simulation. The flow 200 includes simulating circuit descriptions to generate circuit properties 210. The flow 200 may continue from or be part of the previous flow 100. Various types of simulation may be used, depending on the embodiment, including analog simulation such as various implementations of a SPICE simulator, digital simulation evaluated at discrete clock intervals, mixed-mode simulation, random-vector simulation, constraint-based verification, or any other type of circuit simulator or verifier. In some embodiments a single simulation is run to generate the circuit properties, but in other embodiments, multiple runs of the same simulator may be run, and/or multiple simulators may be used to generate the circuit properties.

The circuit properties from the simulation(s) can then be linked with blocks, nodes, and/or devices shown within the circuit description. The linking can be done using a common namespace, by merging the simulation data into the netlist, or by any other method. So because the treemap can be created using blocks and/or nodes from the circuit description, some embodiments, link at least one of the circuit properties with a block within the treemap representation 212, some embodiments link at least one of the circuit properties with a node within the treemap representation 214, and some embodiments link at least one of the circuit properties with a device within the treemap representation. A circuit property, in most embodiments, will be linked with a block, node, or device associated with that property. So for example, if a particular node is determined to have a particular voltage at a particular time in the simulation, a circuit property of that particular voltage at that particular time may be linked with that particular node. As another example, if a particular device is identified as a digital device for simulation, the circuit property of "digital device" may be linked with that particular device.

Some embodiments generate combinations of circuit properties 220, such as circuit properties based on the topology of the circuit and/or the circuit properties generated by the simulations, to generate composite circuit properties. The composite circuit properties can be calculated using regular expressions, Boolean operations, and/or arithmetic expressions. The composite circuit properties may also be linked with blocks, nodes and/or device of the circuit description, and therefore, linked with blocks, devices, or nodes within the treemap representation.

The flow 200 also includes building a hierarchical view for the treemap representation 230. The hierarchical information may be explicitly included in the circuit description, such as in a hierarchical netlist, or the hierarchical information may be implicitly included in the circuit description, such as in the form of names of blocks, devices, and nodes, or the organization of objects in the circuit description. The hierarchical view may include rectangles within rectangles to represent the hierarchy, where a first rectangle may represent a first block at an upper level of hierarchy, and rectangles inside of the first rectangle represent other blocks, devices and/or nodes contained within the first block at a lower level of hierarchy.

The flow 200 also includes debugging a design-related problem or a simulator-related problem 240 using the treemap representation and the circuit properties displayed on the treemap representation 250. The displaying of the circuit properties on the treemap representation may be useful for the debugging. An example of a debugging a design-related problem using the treemap representation is illustrated by the tracing of an incorrect digital output back through the cone of logic that feeds that output to find which node is causing the incorrect digital output. An example of debugging a simulator-related problem is illustrated by the highlighting of digital devices to see which analog device is incorrectly identified as a digital device. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Figure 3:
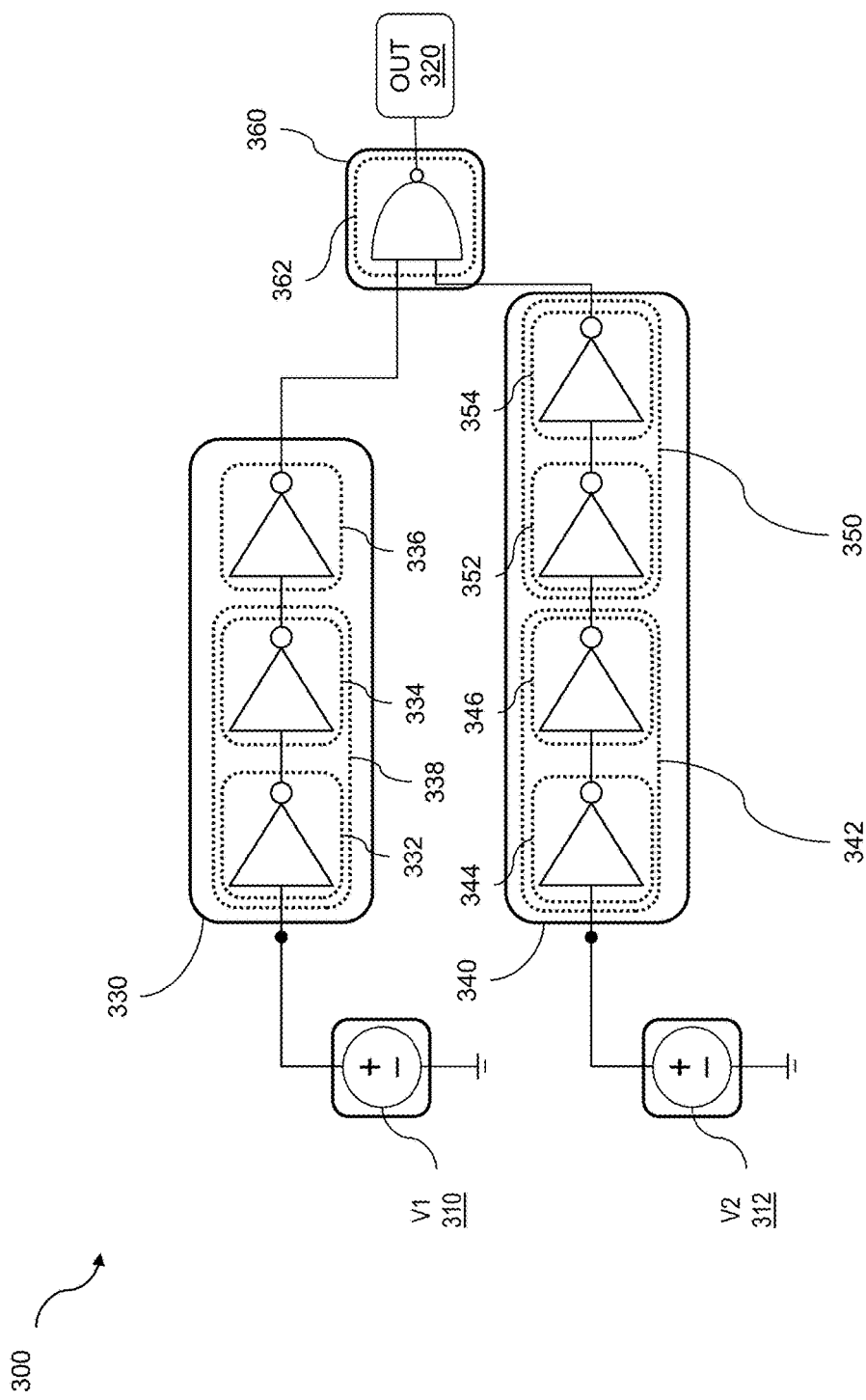
FIG. 3 shows example circuit partitions.

FIG. 3 shows example circuit partitions. The circuit 300 includes two inputs, input V1 310 and input V2 312, and one output 320. Three high level blocks are also included in the circuit 300, a first block 330, a second block 340 and a third block 360. The first block 330 is made up of two lower level blocks, block 336 and block 338. Sub block 338 is made up of two even lower level blocks, block 332 and block 334. The second block 340 is made up of two lower level blocks, block 342 and block 350, which are each made up of two even lower level blocks: block 342 is made up of block 344 and block 346, and block 350 is made up of block 352 and block 354. Block 332, block 334, block 336, block 344, block 346, block 352, and block 354 are each an inverter that is made up of two devices, a p-channel field-effect transistor (PFET) and an n-channel field-effect transistor (NFET) in a well-known pull-up/pull-down configuration with a channel connection. The third block 360 includes one lower level block 362 that is a NAND gate, which is made up of four devices in a well-known configuration, two PFETs in parallel as a pull-up, and two NFETs in series as a pull-down, that all have a channel connection.

A circuit description of the circuit 300 can include a netlist. A netlist can be formatted in many different ways but one common format of a netlist includes a list of nodes, with a list of ports of devices that connect to a node provided for each node. A netlist can be hierarchical or flat. An example flat nodal netlist of the circuit 300 is provided below:

```
//START OF NODAL NETLIST FOR CIRCUIT 300
VSS: P332S, P334S, P336S, P344S, P346S, P352S, P354S, P362AS,
    P362BS;
GND: N332D, N334D, N336D, N344D, N346D, N352D, N354D,
    N362BD, 312N, 310N;
N1: 310P, P332G, N332G;
N2: P332D, N332S, P334G, N334G;
N3: P334D, N334S, P336G, N336G;
N4: P336D, N336S, P362AG, N362AG;
N5: 312P, P344G, N344G;
N6: P344D, N344S, P346G, N346G;
N7: P346D, N346S, P352G, N352G;
N8: P352D, N352S, P354G, N354G;
N9: P354D, N354S, P362BG, N362BG;
N10: N362AD, N362BS;
N11: P362AD, P362BD, N362AS, 320O;
//END OF NODAL NETLIST FOR CIRCUIT 300
```

In the example netlist above, a port name is based on the reference number of the lowest level block that contains the device in the circuit 300. If the device is a transistor, a prefix of "P" indicates that the device is a PFET of that block, and a prefix of "N" indicates that the device is an NFET of that block. If there is more than one FET of the same type in a block, the reference number is followed by an "A" or a "B" to indicate which FET is being referenced. The suffix indicates which port of the device is connected in the node, with a suffix of "S" indicating the source of the FET, a suffix of "G" indicating the gate of the FET, a suffix of "D" indicating the drain of the FET, a suffix of "N" indicating a negative terminal of a voltage source, a suffix of "P" indicating a positive terminal of a voltage source, and a suffix of "O" indicating an output terminal.

Another type of netlist has a list of devices, with a node name provided for each port of the device. The ports can be explicitly named in the netlist, or can be implied based on a known order of the ports, depending on the embodiment. An example device-based netlist is provided below:

```
//START OF DEVICE BASED NETLIST FOR CIRCUIT 300
310: N-GND, P-N1;
312: N- GND, P-N5;
P332: S-VSS, G-N1, D-N2;
N332: S-N2, G- N1, D- GND;
P334: S- VSS, G-N2, D-N3;
N334: S-N3, G- N2, D- GND;
P336: S- VSS, G-N3, D-N4;
N336: S- N4, G- N3, D- GND;
P344: S- VSS, G-N5, D-N6;
N344: S-N6, G- N5, D- GND;
P346: S- VSS, G-N6, D-N7;
N346: S-N7, G- N6, D- GND;
P352: S- VSS, G-N7, D-N8;
N352: S-N8, G- N7, D- GND;
P354: S- VSS, G-N8, D-N9;
N354: S-N9, G- N8, D- GND;
P362A: S- VSS, G-N4, D-N11;
P362B: S- VSS, G-N9, D-N11;
N362A: S-N11, G- N4, D-N10;
N362B: S-N10, G-N9, D- GND;
320: O-N11;
//END OF DEVICE BASED NETLIST FOR CIRCUIT 300
```

Some embodiments use a hierarchical netlist where a hierarchy is defined in the netlist. An example of a hierarchical netlist is provided below:

```
//START OF HIERARCHICAL NETLIST FOR CIRCUIT 300
310: N-GND, P-N1;
312: N- GND, P-N5;
330: I-N1, O-N4, B1-338, B2-336;
340: I-N5, O-N9, B1-342, B2-350;
360: I1-N4, I2-N5, O-N11, B1-362;
338: I-330.I, O-330.T, B1-332, B2-334;
336: I-330.T, O-330.O, B1-INV;
332: I-338.I, O-338.T, B1-INV;
334: I-338.T, O-338.O, B1-INV;
342: I-340.I, O-340.T, B1-344, B2-346;
350: I-340.T, O-340.O, B1-352, B2-354;
344: I-342.I, O-342.T, B1-INV;
346: I-342.T, O-342.O, B1-INV;
352: I-350.I, O-350.T, B1-INV;
354: I-350.T, O-350.O, B1-INV;
362: I1-360.I1, I2-360.I2, O-360.O, B1-NAND;
320: O-N11;
INV: I-PAR.I, O- PAR.O, B1-PINV, B2-NINV;
PINV: S-VSS, G- PAR.I, D- PAR.O;
NINV: S- PAR.O, G- PAR.I, D- GND;
NAND: I1- PAR.I1, I2- PAR.I2, O- PAR.O, B1-PINVA, B2-PINVB,
    B3-NINVA, B4-NINVB;
PINVA: S- VSS, G- PAR.I1, D- PAR.O;
PINVB: S- VSS, G- PAR.I2, D- PAR.O;
NINVA: S- PAR.O, G- PAR.I1, D- PAR.T;
NINVB: S- PAR.T, G- PAR.I2, D- GND;
//END OF HIERARCHICAL NETLIST FOR CIRCUIT 300
```

Note that the device-based netlist for the circuit 300 has the same information as the nodal netlist for circuit 300, but is formatted differently. The hierarchical netlist includes all of the information of the nodal or device based netlist, but includes additional information about the hierarchy. In the example hierarchical netlist, a block is defined by the reference number and the connections to the inputs and outputs of that block are provided. Any blocks that are inside of the block are defined as "Bx" where "x" is the sub-block and the sub-block reference number. The INV, PINV, and NINV blocks are used in multiple locations, but because each instantiation has its own context, each instantiation is unique, with its own unique connections. Note that the VSS and GND nodes are global. For a sub-block, its inputs and outputs are defined in the context of its parent block. "PAR" identifies the parent block of a block that is used multiple times in the hierarchical netlist above. The formats of the netlists provided above are intended as examples, and might not be used in any specific embodiment. Many formats for netlists are well known in the art, and any format may be used for a netlist, depending on the embodiment. Some embodiments may be able to accept netlists in several different formats.

Figure 4:
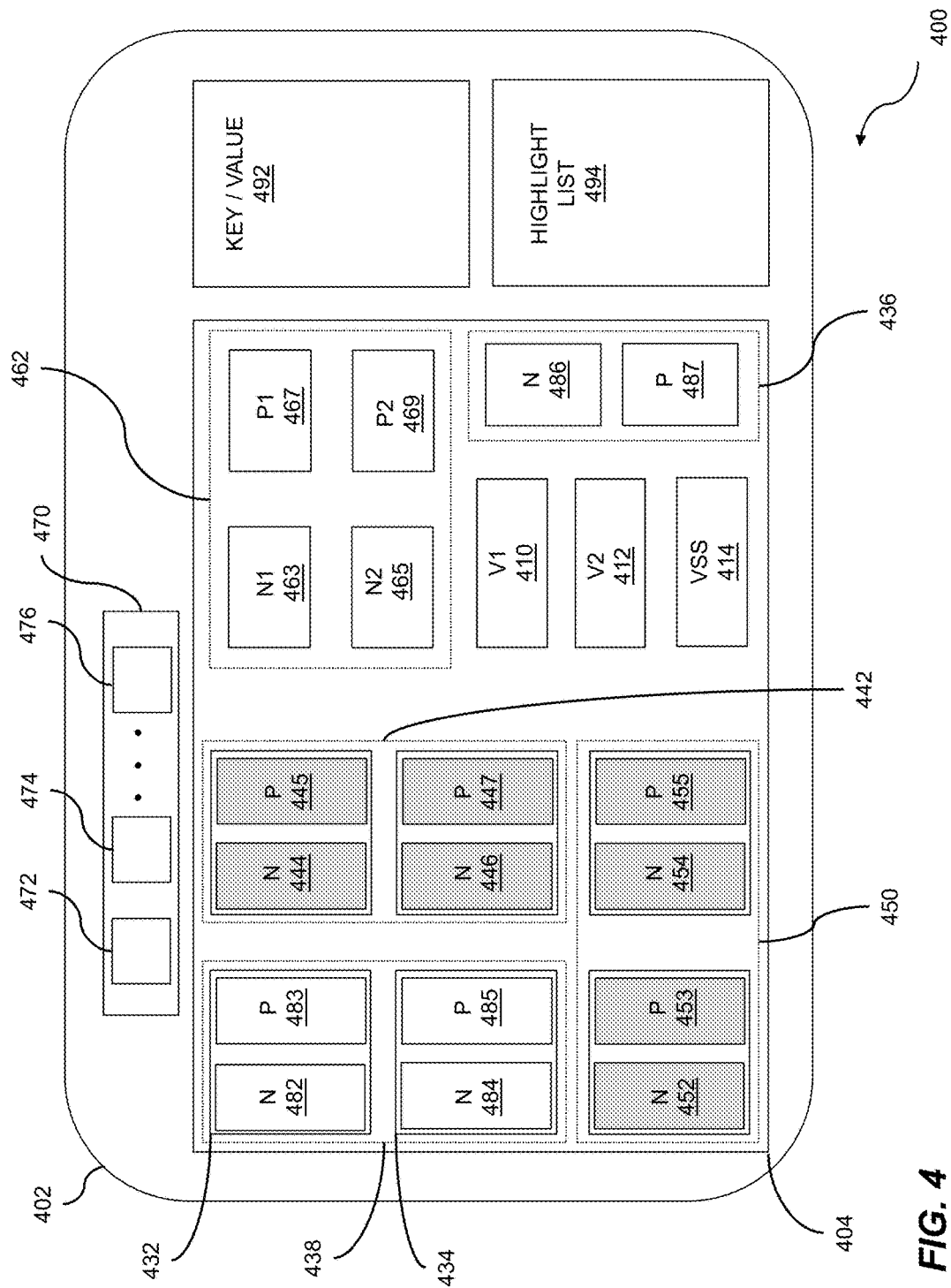
FIG. 4 is an example treemap display.

FIG. 4 is an example treemap display. A computer program is used to generate a user display 400 in the displayable area 402 of a computer monitor or other electronic display. The computer program displays a treemap display 404. In some embodiments, the treemap display 404 can fill the entire displayable area 402 at certain times, but be shrunk to a window within the displayable area 402 at other times.

Other windows may be provided by the computer program in some embodiments at some times. Some embodiments include a tool bar 470 or other user interface elements, which allow the user to interact with the computer program and/or the circuit description. The tool bar 470 may have one or more user interface elements, such as a button 472, a pull-down menu 474, a text entry box 476, and/or other elements. Some embodiments include a properties window 492 that can show a list of keys, or properties, for one or more selected objects, along with the values for those keys/properties. Some embodiments include a highlight window 494 to show a list of highlighted objects. Other embodiments may include additional windows for other functions. Each window may include standard window control features to allow scrolling, zooming, resizing and other functionality of the window controlled by the windowing system used by the computer program.

The example treemap display 404 includes a virtual placement of a treemap representation of the circuit description. The treemap representation might not be based on a physical layout. In some embodiments, this allows the treemap representation to substantially match the aspect ratio of a display window. A device-based treemap representation of the circuit 300 of FIG. 3 is shown in the treemap display 404. The treemap display 404 shows some of the hierarchy of the circuit 300, but not all of the hierarchy. The treemap display 404 may be configured to show various levels of hierarchy in some embodiments. The treemap display shows the power supply, VSS, as object 414, and input voltages V1 and V2 as object 410 and object 412 respectively.

The NAND 362 is shown as a hierarchical object 462 with NFET1, object 463, NFET2 object 465, PFET1 object 467, and PFET2 object 469, shown inside the object 462 to show the hierarchy. Note that the connections between the objects are not shown in this embodiment. A higher level hierarchical object 438 represents block 338, higher level hierarchical object 442 represents block 342 and higher level hierarchical object 450 represents block 350. Inverter 332 is represented by object 432 and inverter 334 is represented by object 434, with both objects 432 and 434 shown inside of object 438 to represent the hierarchy. Inverters 344 and 346 of block 342 are shown as objects inside of object 442, and inverters 352 and 354 are shown as objects inside of object 450. Inverter 336 is shown as object 436, but is not included in a higher-level block because higher-level hierarchical block 330 is not shown in the treemap representation of the example treemap display 404.

The devices that make up the inverters are also shown as objects inside of the object representing their respective inverters. Inside of object 432, representing inverter 332, object 482 represents the NFET of inverter 332 and object 483 represents the PFET of inverter 332. Inside of object 434, representing inverter 334, object 484 represents the NFET of inverter 334 and object 485 represents the PFET of inverter 334. Inside of object 436, representing inverter 336, object 486 represents the NFET of inverter 336 and object 487 represents the PFET of inverter 336. Inside of object 442, representing the pair of inverters 342, object 444 represents the NFET of inverter 344 and object 445 represents the PFET of inverter 344. The object 446 represents the NFET of inverter 346 and object 447 represents the PFET of inverter 346. Inside of the object 450 representing the pair of inverters 350, object 452 represents the NFET of inverter 352 and object 453 represents the PFET of inverter 352. And object 454 represents the NFET of inverter 354 while object 455 represents the PFET of inverter 354.

Many types of circuit properties can be shown on the treemap representation. In FIG. 4, the objects that are included in block 340, or have the circuit property of being in the partition represented by block 340, are highlighted. In some embodiments, a user can select one or more properties to show on the treemap representation in the treemap display 404. As an example, the objects can be color coded to indicate a circuit property, such as switching activity. As another example, power dissipation can be shown using a "height" of a 3D representation of the objects. In some embodiments, a user can select one or more objects to have additional information about the object(s) shown. The additional information can be shown in the object, in a separate window, or as a pop-up in the treemap display 404. Other examples of circuit properties that may be displayed on the treemap representation in various embodiments include, but are not limited to, a timing, a power, a frequency, a voltage, a waveform, a nodal activity, a current, a fan-in dependency, a fan-out dependency, a convergence problem, an activity level, a noise level, a temperature, and device aging.

Figure 5:
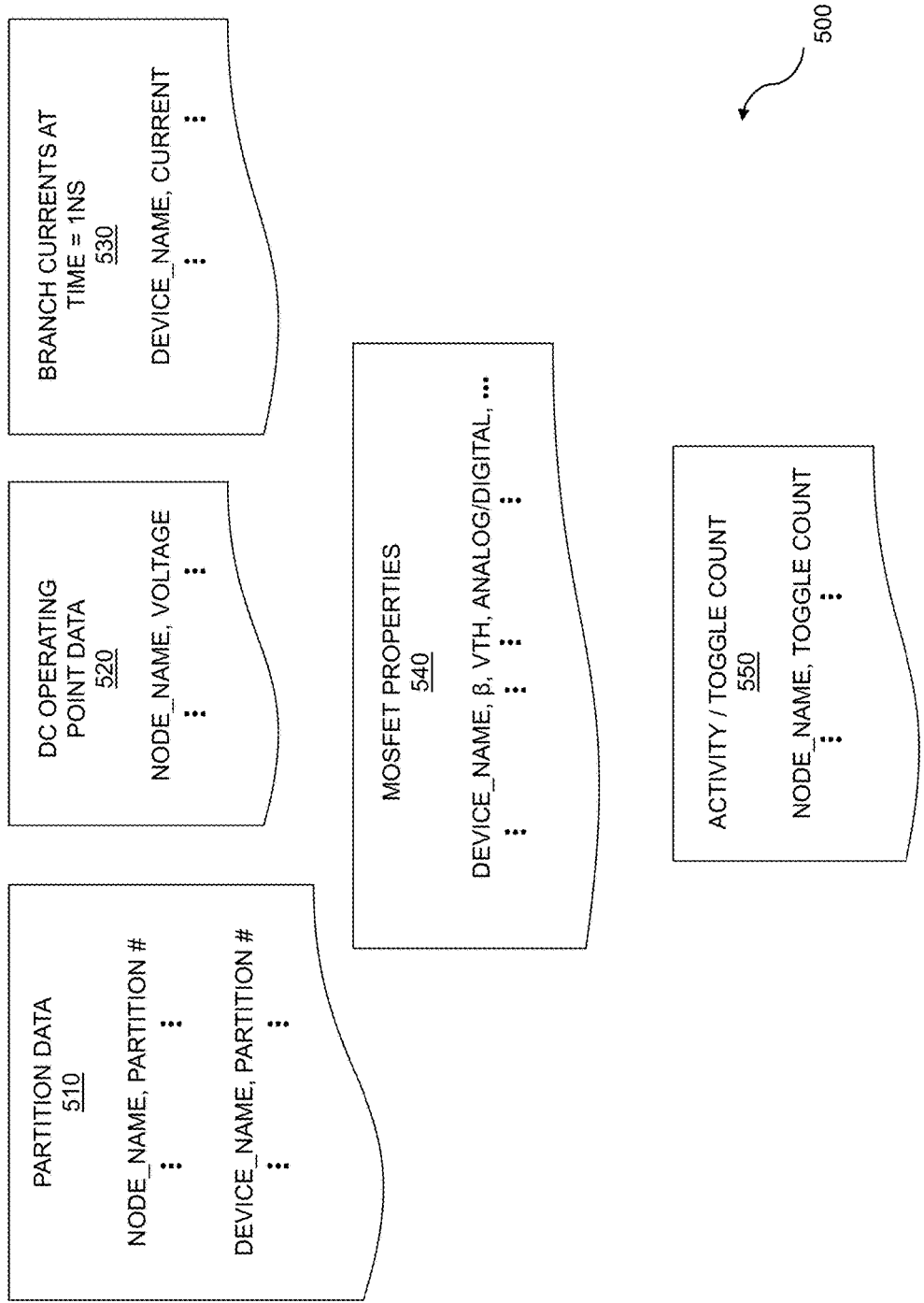
FIG. 5 shows example node/device property data.

FIG. 5 shows example node/device property data 500. The files shown in FIG. 5 are meant as examples; other embodiments may use other types of data, and/or may combine the types of data shown here as separate files into combined files, depending on the embodiment. The predetermined information shown, or other information, may be obtained, and some or all of the information displayed on the treemap representation of the electronic design. The predetermined information can be used in conjunction with circuit properties concurrently calculated in a simulator, and even combined using Boolean combinations, regular expressions, and/or arithmetic functions to create composite circuit properties or tags, in some embodiments.

A first file in this example holds partition data 510. The partition data includes hierarchical information about the design, such as which partition of the design each node and/or device is a part of. The partition data 510 may be extracted from the design description, or may be provided as a part of the design description. The partition data may describe the hierarchy in some embodiments, or may simply describe associated devices and/or nodes.

A second file in this example holds direct current (DC) operating point data 520. The DC operating point data 520 may be pre-calculated for the various devices to determine voltage levels at nodes connected to those devices. A third file in this example holds branch currents 530 at a time equal to 1 nanosecond (ns) after the start of the simulation. In some embodiments, each item in the list is a device, and contains information regarding currents into each of the ports of that device, but in other embodiments, each item in the list is a single port of a device with a single current for that port.

A third file in this example holds metal-oxide-semiconductor field-effect transistor (MOSFET) properties 540. In the example shown, a list of MOSFET devices is included in file along with several MOSFET properties for that MOSFET, such as gain ($\beta$), threshold voltage ($V_{TH}$), and whether the MOSFET is intended to be used as an analog or digital device. Other properties are included in other embodiments. A fifth file of this example holds activity/toggle count 550 for nodes over a specific period of time. This file contains a list of nodes and an associated number of times that the node toggles between digital states in the specific period of time.

The five files of FIG. 5 provide a small set of examples as to the type of information that can be obtained and displayed on the treemap representation of various embodiments. Some embodiments also perform simulation concurrently to the display of the circuit properties on the treemap representation. Some embodiments may rely only on the concurrently calculated simulation data to determine circuit properties, some may rely only on predetermined circuit properties, and others may use both concurrently simulated circuit properties and predetermined data circuit properties. The circuit properties may include one or more of a timing, a power, a frequency, a voltage, a waveform, a nodal activity, a current, a fan-in dependency, a fan-out dependency, a convergence problem, an activity level, a noise level, a temperature, and device aging, depending on the embodiment.

Figure 6:
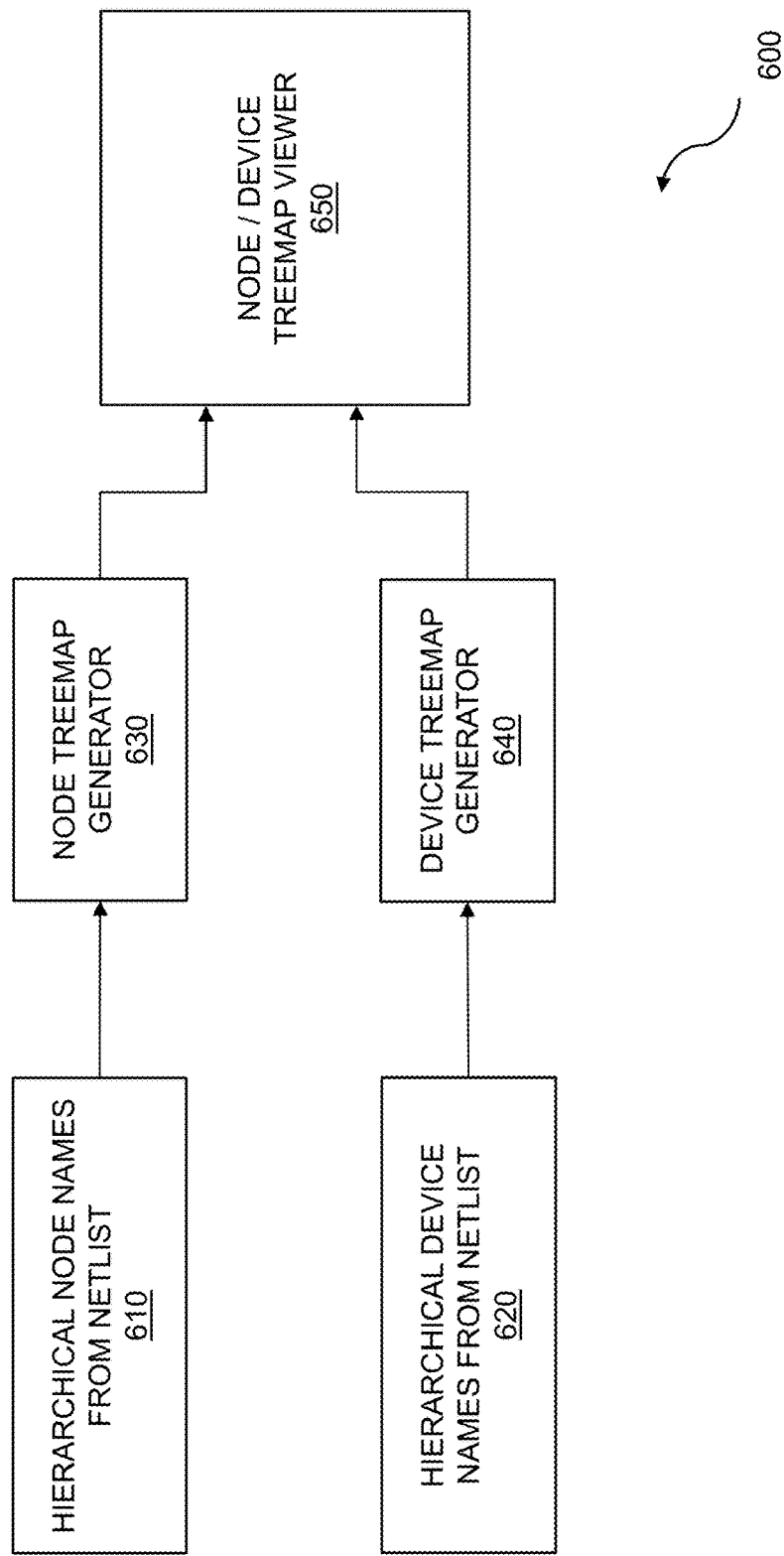
FIG. 6 is an example data flow for treemap generation.

FIG. 6 is an example data flow for treemap generation. In the flow 600, hierarchical node names are obtained from a netlist 610. The hierarchical node names may be explicitly defined in the netlist obtained, or may be extracted from implicit information in the netlist, such as from node names or device names.

The flow 600 continues by providing the hierarchical node names 610 to a node treemap generator 630. The node treemap generator 630 uses the node names to generate a node treemap representation that uses the nodes as objects in the treemap representation. In some embodiments, the node treemap representation uses rectangles to represent the nodes in a virtual layout that is created to match the aspect ratio of the display or a treemap display window. In some embodiments, the node treemap representation also shows hierarchical information.

In the flow 600, hierarchical device names are obtained from a netlist 620. The hierarchical device names may be explicitly defined in the netlist obtained, or may be extracted from implicit information in the netlist, such as from device names or node names. The flow 600 provides the hierarchical device names 620 to a device treemap generator 640. The device treemap generator 640 uses the device names to generate a device treemap representation that uses the devices as objects in the treemap representation. In some embodiments, the device treemap representation uses rectangles to represent the devices in a virtual layout that is created to match the aspect ratio of the display or a treemap display window. In some embodiments, the device treemap representation also shows hierarchical information.

The flow 600 also includes a node/device treemap viewer 650. The node/device treemap viewer 650 receives the node treemap representation from the node treemap generator 630, and the device treemap representation from the device treemap generator 640. The node/device treemap viewer 650 can show either the node treemap representation or the device treemap representation to a user. In some embodiments, the user can select which treemap representation to display. In some embodiments, both the node treemap representation and the device treemap representation can be simultaneously displayed as separate treemap representations or as a combined node/device treemap representation. Rectangles can be used to represent nodes in the node treemap representation and devices in the device treemap representation, as well as hierarchical blocks in either type of treemap representation. The rectangles in the treemap representation can also be referred to as leaves, so leaves in the treemap representation may represent one or more of blocks, devices, or nodes.

In some embodiments, the node/device treemap viewer 650 also allows the user to select circuit properties to display on the treemap representation(s). The circuit properties can be represented by any type of visual indicator on the treemap representation, including, but not limited to, color, cross-hatching, highlighting, line thicknesses, icons, text, waveforms, or animations. In some embodiments, separate windows are provided by the node/device treemap viewer 650 for display of other information about the circuit represented by the treemap representation(s), such as a list of selected objects, circuit properties, or waveforms for a selected object or any other type of textual or graphical information. In some embodiments, the node/device treemap viewer 650 allows a user to interact with the treemap representation(s) by mousing over objects, clicking on objects, or other human/computer interactions.

Figure 7:
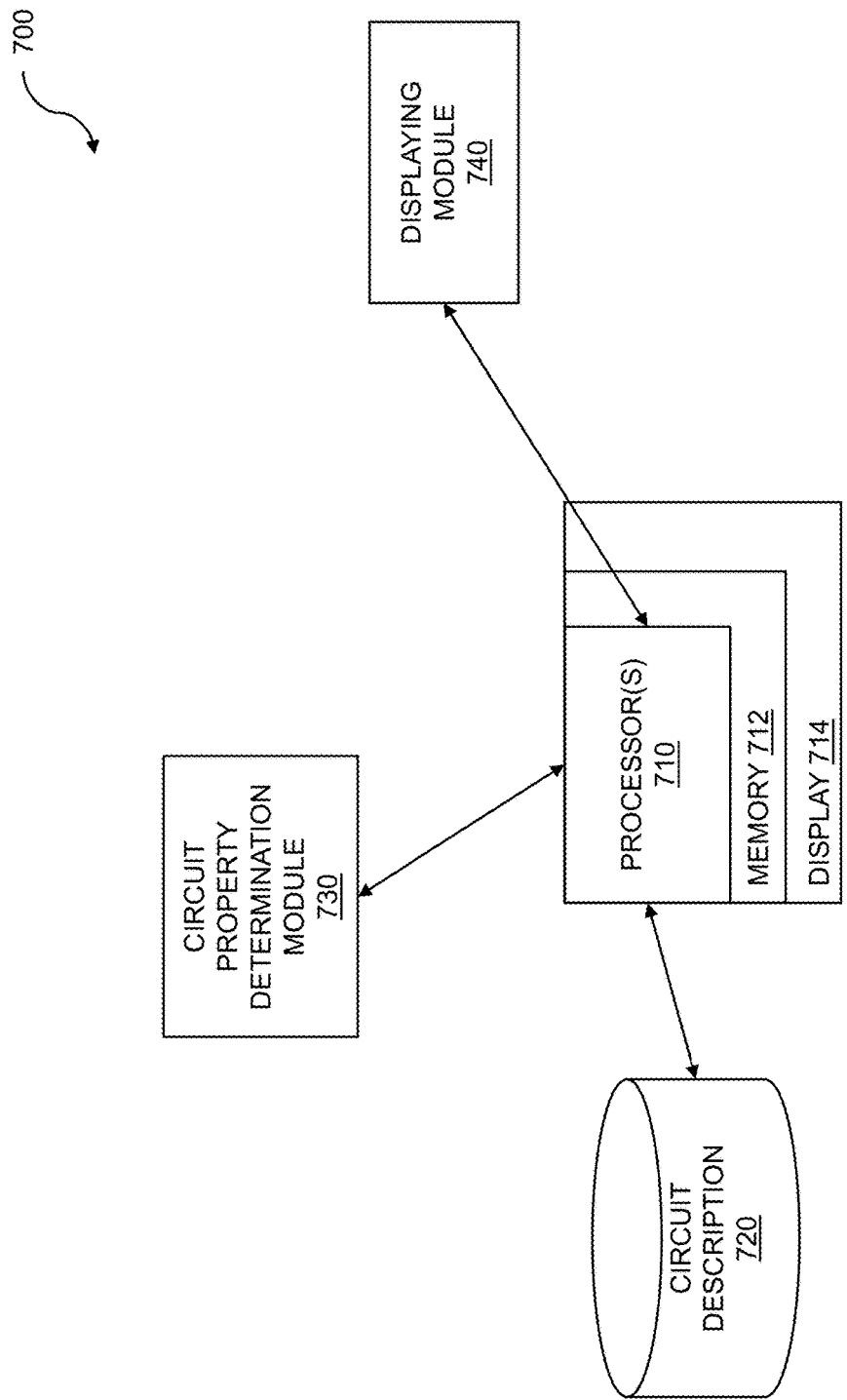
FIG. 7 is a system diagram for visual representation of circuit data.

FIG. 7 is a system diagram for visual representation of circuit data. The example system 700 includes one or more processors 710 coupled to memory 712 which can be used to store computer code instructions and/or data, such as design descriptions, netlists, simulation data, treemap data, rendered images, instructions, intermediate data, circuit properties, and the like. A display 714 is also included in some embodiments, and can be any electronic display, including but not limited to, a computer display, a laptop screen, a net-book screen, a tablet screen, a cell phone display, a mobile device display, a remote with a display, a television, a projector, or the like. A circuit description 720 that may include a netlist that is stored on a computer disk or other computer storage medium. A circuit property determination module 730 is included in the system 700 and determines circuit properties of the design described by the circuit description 720. In some embodiments, the circuit property determination module 730 includes one or more simulation engines. A displaying module 740 is included in the system 700 and renders a circuit representation based on the circuit description using a treemap representation and display circuit properties of the treemap representation on the display 714. In at least one embodiment, the functions of the determination module 730 and the displaying module 740 are accomplished or augmented by the one or more processors 710.

The system 700 can include computer program product embodied in a non-transitory computer readable medium for circuit visualization. The non-transitory computer readable medium, which may also store the circuit description in some cases, can be any type of computer storage medium, including, but not limited to, a hard disc drive, an optical disc, a flash memory based device, or semiconductor memory. The computer program product includes code for obtaining a circuit description, code for rendering a circuit representation based on the circuit description using a treemap representation, and code for displaying circuit properties on the treemap representation. In the system 700, the one or more processors 710 can be configured to obtain the circuit description 720, render a circuit representation based on the circuit description using a treemap representation, and display circuit properties on the treemap representation. In the system 700, the one or more processors 710 may also be configured to perform any of the computer implemented methods described herein.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for simulating a circuit comprising:
    obtaining a circuit description;
    rendering a circuit representation based on the circuit description using a treemap representation;
    displaying circuit properties on the treemap representation;
    simulating the circuit using the displayed circuit properties;
    performing a Boolean combination of the properties to generate a new circuit property;
    linking the new circuit property with a block within the treemap representation; and
    highlighting the block to which the new circuit property was linked so as to design the circuit.

2. The method of claim 1 wherein the displaying of the circuit properties is accomplished by mousing over an object in the treemap representation.

3. The method of claim 2 wherein the object includes a device, a block, a node, or a property.

4. The method of claim 1 wherein leaves in the treemap representation represent one or more of blocks, devices, or nodes.

5. The method of claim 1 further comprising performing one or more of Boolean combination or regular expression combination of properties to generate the circuit properties which are displayed.

6. The method of claim 1 further comprising simulating the circuit description to generate circuit properties.

7. The method of claim 6 wherein the circuit properties includes one or more of a timing, a power, a frequency, a voltage, a waveform, a nodal activity, a current, a fan-in dependency, a fan-out dependency, a logic cone, a convergence problem, an activity level, a noise level, a temperature, a sensitivity, and device aging.

8. The method of claim 6 further comprising linking at least one of the circuit properties with a block within the treemap representation.

9. The method of claim 6 further comprising linking at least one of the circuit properties with a node within the treemap representation.

10. The method of claim 1 further comprising building a hierarchical view for the treemap representation.

11. The method of claim 1 wherein the treemap representation includes a virtual placement.

12. The method of claim 1 further comprising debugging a design-related problem or a simulator-related problem using the treemap representation and the displaying of the circuit properties.

13. The method of claim 1 wherein the displaying includes a colorization, a line-type modification, or a cross-hatch modification of the treemap representation.

14. The method of claim 13 wherein the displaying highlights a difference between two or more simulations.

15. The method of claim 1 wherein the treemap representation is not based on physical layout.

16. The method of claim 1 wherein the treemap representation matches an aspect ratio of a display window.

17. A computer-implemented method for designing a circuit comprising:
obtaining a circuit description;
rendering a circuit representation based on the circuit description using a treemap representation;
displaying circuit properties on the treemap representation, wherein the displaying further comprises partitioning the circuit representation;
designing the circuit using the displayed circuit properties, wherein the partitioning is based on one or more of channel connections, DC connected paths, AC connected paths, or low impedance paths.

18. A computer-implemented method for designing a circuit comprising:
obtaining a circuit description;
rendering a circuit representation based on the circuit description using a treemap representation;
displaying circuit properties on the treemap representation;
designing the circuit using the displayed circuit properties, wherein the displaying includes showing a frame sequence that describes circuit properties over time.

19. A computer system configured to simulate a circuit, the computer system comprising:
a memory which stores instructions and one or more processors coupled to the memory, wherein the one or more processors are configured to:
obtain a circuit description;
render a circuit representation based on the circuit description using a treemap representation;
display circuit properties on the treemap representation;
simulate the circuit using the displayed circuit properties;
perform a Boolean combination of the properties to generate a new circuit property;
link the new circuit property with a block within the treemap representation; and highlight the block to which the new circuit property was linked so as to design the circuit.

* * * * *